United States Patent [19]
Schmitt

[11] Patent Number: 5,739,466
[45] Date of Patent: Apr. 14, 1998

[54] CASING FOR ELECTRONIC COMPONENTS HAVING INSULATED PASSAGES

[75] Inventor: Theodore Schmitt, Vienna, Austria

[73] Assignee: Electrovac, Fabrikation Electrotechnischer Spezialartikel Gesellschaft m.b.H., Klosterneuburg, Austria

[21] Appl. No.: 415,079

[22] Filed: Mar. 30, 1995

[30] Foreign Application Priority Data

Mar. 30, 1994 [AT] Austria ............... 682/94

[51] Int. Cl.⁶ .................................................. H05K 5/06
[52] U.S. Cl. .................................................. 174/50.61
[58] Field of Search ................... 174/50.61, 50.5, 174/52.6, 52.4

[56] References Cited

U.S. PATENT DOCUMENTS

| | | | |
|---|---|---|---|
| 3,370,874 | 2/1968 | Scherer et al. | 174/50.61 X |
| 4,128,697 | 12/1978 | Simpson | 174/50.61 X |
| 4,292,464 | 9/1981 | Vogt et al. | 174/50.61 X |
| 4,453,106 | 6/1984 | La Fiandra | 174/50.61 X |
| 4,704,557 | 11/1987 | Ierna | 174/50.61 X |
| 4,707,424 | 11/1987 | Bowsky et al. | 174/50.61 X |
| 5,140,109 | 8/1992 | Matsumoto et al. | 174/50.61 X |
| 5,175,067 | 12/1992 | Taylor et al. | 174/50.61 X |
| 5,227,250 | 7/1993 | Bobal et al. | 174/50.61 X |
| 5,308,925 | 5/1994 | Paterek et al. | 174/50.61 X |
| 5,317,107 | 5/1994 | Osorio | 174/52.4 |

*Primary Examiner*—Kristine L. Kincaid
*Assistant Examiner*—Dean A. Reichard
*Attorney, Agent, or Firm*—Henry M. Feiereisen

[57] ABSTRACT

A molded part, in particular a casing for electronic components, includes a cast body made in one piece of a material selected from the group including metal and metal matrix composite, and having passages made of an electrically insulating material for receiving a conductor, whereby the material of the body is cast onto the passages.

4 Claims, 3 Drawing Sheets

CASING FOR ELECTRONIC COMPONENTS HAVING INSULATED PASSAGES

BACKGROUND OF THE INVENTION

The present invention refers to a molded part, such as a casing for electronic components, and in particular to a molded part of a type having electrically insulated passages for receiving conductors, and further to a method of and apparatus for making such a molded part.

In general, the inside and outside of the insulating material for the conductor passages are metallized by burning in metal in a separate working step. Subsequently, the insulating material is e.g. soldered into the assembled molded part. It is also known, to provide the conductor passages in the molded parts by melting glass pellets into incorporated bores of the molded part, with the conductor being already received in the glass pellet.

A drawback of conventional methods is, on the one hand, the cumbersome preparatory treatment of the conductor passages, and, on the other hand, the necessity to use types of glass which have a melting point lower than the melting point of the metal of the molded part in order to ensure that during melting of the glass the molded part does not deviate from the predetermined geometry. In particular, the use of low-melting metals for the molded part makes it impossible to produce vacuum-tight conductor passages when using glass as insulator since low-melting glass is susceptible to corrosion and less-resistant than high-melting glass.

SUMMARY OF THE INVENTION

It is an object of the present invention to provide an improved molded part obviating the afore-stated drawbacks.

In particular it is an object of the present invention to provide a qualitatively high-grade molded part of metal, preferably aluminum or aluminum alloys, in particular vacuum-tight casing for electronic components, with electrically insulated conductor passages, which can be made more rapidly, reproducibly and more durable with regard to its properties, especially the density.

It is a further object of the present invention to provide a method for making an improved molded part in a more simple and yet reliable manner.

It is yet another object of the present invention to provide an apparatus for making an improved molded part in a simple and more reliable manner.

These objects and others which will become apparent hereinafter are attained in accordance with the present invention by casting a body in one piece of metal and/or at least partially of a metal matrix composite (MMC-material), with the metal for the molded body being cast onto the electrically insulating passages.

It has surprisingly been found that the forming interface between the insulating material of the conductor passages and the metal for the molded part ensures a superior vacuum tightness which can further be gradually improved when applying a die casting process. Examples for the insulating material include ceramics or glass with a higher melting point than the melting point of metal. Thus, glass types can be utilized which have a higher melting point than the melting point of the material for the molded body.

The properties of the interface between the insulating material for the conductor passages and the metal of the molded body can even further be gradually improved by coating or plating the insulating material with metal, e.g. through placement of a metal ring or the like, onto which the metal of the molded body is cast.

Since the present invention refers to a cast molded body, it is also possible according to another feature of the present invention to make the conductors that are received in the passages from the same material as the molded body.

A method according to the present invention is preferably carried out by placing at least the insulating material of the electrically insulated conductor passages in a casting mold which has a cavity of a contour resembling the molded part being formed, subsequently filling the cavity and the passages with metal, possibly under application of pressure, allowing the metal to solidify and removing the finished molded part from the casting mold.

Thus, the molded part, in particular casings for electronic components, can be made rapidly and reliably in a single working step with vacuum-tight electrically insulated conductor passages, regardless of whether the molded part is made of metal or a metal matrix composite alone or a combination thereof.

When using in accordance with another feature of the present invention a multipart MMC-preform of respectively different materials, the creation of different thermal expansion coefficients in view of the configuration of the molded part, e.g. due to differently sized casing walls, can be compensated in a superior manner so that a formation of cracks or a deformation of the molded part at significant temperature fluctuations are prevented. This advantage can also be attained in a multipart preform of the same material when using materials of different density, i.e. bulk density or apparent density.

Especially when making a molded part of MMC-material, the insulating material for the conductor passages, which has a channel for receiving a conductor, can be inserted in bores of the MMC-preform so that during infiltration with metal these channels are filled and form the conductor in the insulated conductor passages.

BRIEF DESCRIPTION OF THE DRAWING

The above and other objects, features and advantages of the present invention will now be described in more detail with reference to the accompanying drawing in which.

DETAILED DESCRIPTION OF PREFERRED EMBODIMENTS

Figure 1:
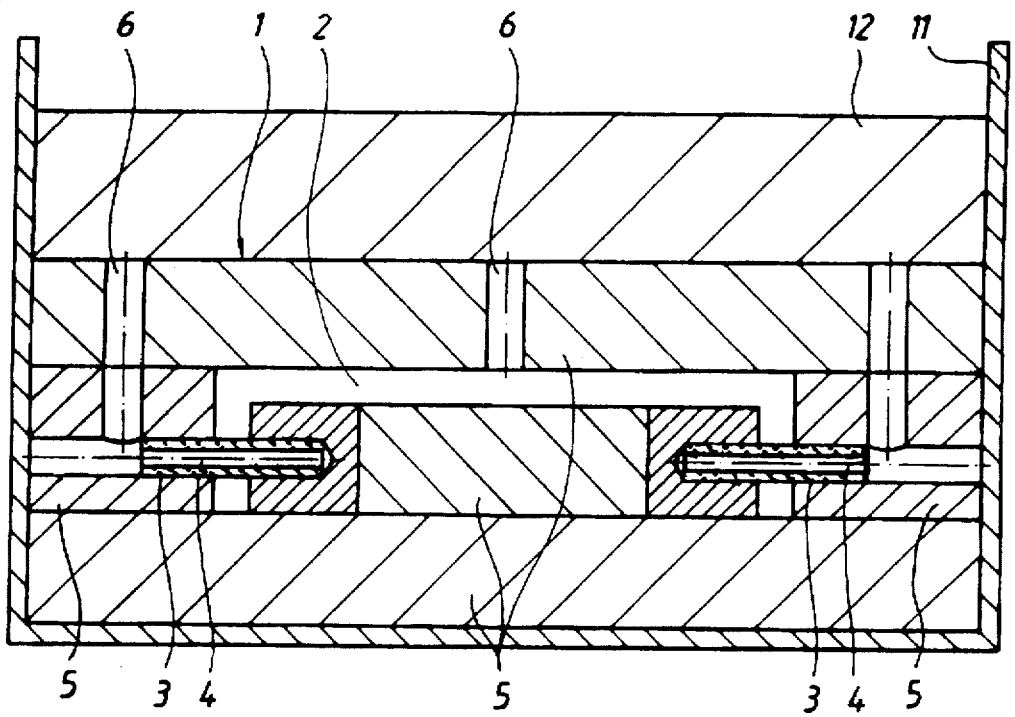
FIGS. 1 to 5 show sectional views of casting molds according to the present invention for making various embodiments of a molded part according to the present invention.

Throughout all the Figures, the same or corresponding elements are always indicated by the same reference numerals.

Turning now to the drawing, and in particular to FIG. 1, there is shown a sectional view of a casting mold, generally designated by reference numeral 1 and set in a case 11. It is noted that the case 11 is shown in the drawings by way of example only and may be a pressure vessel when carrying out the process under pressure.

The casting mold 1 is composed of several mold components 5 to define a cavity 2 that resembles the configuration of a molded part, e.g. a casing of metal, being formed. The cavity 2 is of substantially inverted U-shaped configuration, with its shorter lateral shanks being traversed by inserts in the form of tubes 3 which are made of electrically insulating material, such as ceramics or glass, and form the insulation of the conductor passages. Resting upon the upper mold component 5 of the casting mold 1 is a block or feeder 12 of fusible metal which melts when raising the temperature above its melting point and permeates through runners 6 which vertically traverse the upper mold component 5 and enter the cavity 2. The heating unit, required for melting the block 12, is of conventional type and is omitted from the drawing for sake of simplicity.

When heating the block 12, metal melts and permeates through the runners 6 into the cavity 2 to form the molded part. At the same time, metal flows through the respective runners 6 into the passages 4 of the tubes 3 to also fill the passages 4 with metal for formation of conductors which are suitably electrically insulated by the tubes 3. In order to enable a proper removal of the formed molded part, the casting mold 1 is of multipart structure.

It is certainly within the scope of the invention to make the molded part with the conductors already received in the passages 4 of the tubes 3 when placed in the casting mold 1, assuming that the melting point of the conductor metal, especially the melting point of the bonded structure of conductor metal and insulating material is higher than the melting point of the metal for the molded part. Examples for suitable conductor passages include conductors with glass pellets already being fused thereon, with the melting point of glass being higher than the melting point of the metal for the molded part. Thus, the use of durable high-melting glass types is possible.

In order to improve the mechanical and physical properties of the interface between the metal of the molded part and the tube 3, it may be suitable to coat or impregnate in a separate step the outside of the tube 3 with metal prior to casting.

Figure 2:
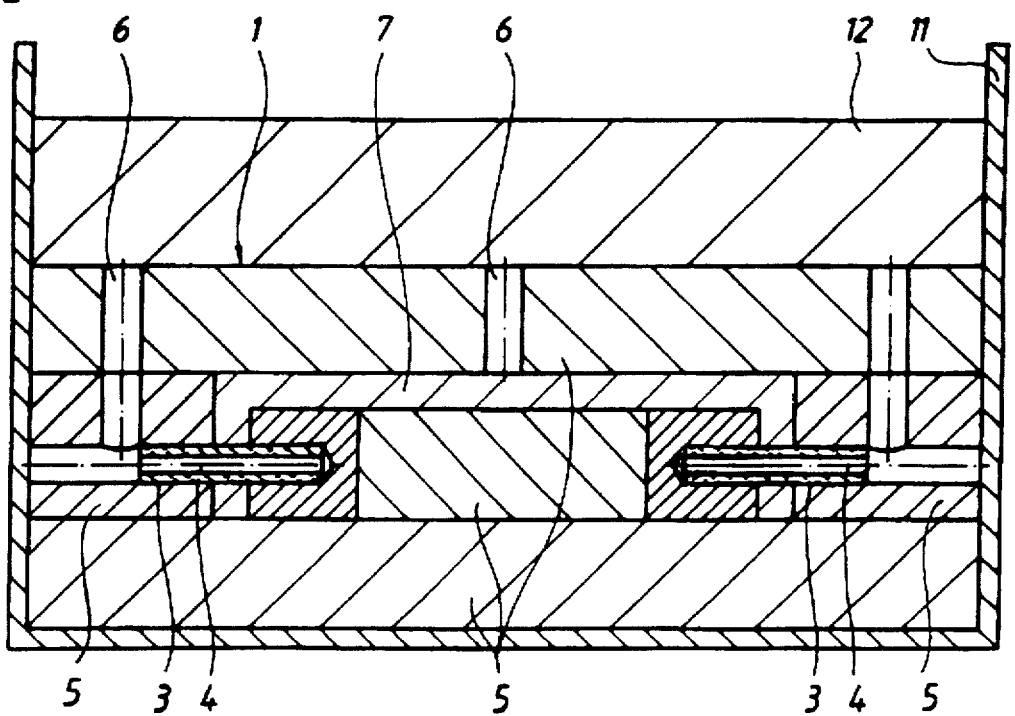

Turning now to FIG. 2, there is shown a sectional view of a casting mold 1 for making a molded part of different configurations. As shown in FIG. 2, the entire cavity 2 is filled with a preform 7 made of MMC-material. Metal matrix composites (MMC) are products in which a preform and metal as matrix are embedded within each other at different quantitative proportions. The preform may be provided in the form of particles, fibers or porous bodies, and can be infiltrated by metal. Depending on the selected type, shape, quantity and porosity of the preform as well as the selected type of infiltration metal, the mechanical, electrical and thermal properties of the finished product can be best suited to required demands. Examples for the MMC-material include aluminum with a preform of silicon carbide (SIC) or Aluminum Nitride (AlN). It is also possible to use carbon fibers, ceramic fibers or the like as preform. Further examples for the matrix of MMC-infiltration material include metals or their alloys e.g. aluminum, magnesium, copper and the like.

It is also possible to use for MMC-preforms a metal with a melting point which is higher than the melting point of the infiltration metal.

When using porous preform material for making such MMC-products, the porous material is permeated by melted metal, in a so called "infiltration process" via the runners 6. Suitably the preform 7 is infiltrated under pressure with the infiltration metal. Depending on the preform material, the solidification or hardening of the liquid metal is carried out at atmospheric pressure, e.g. when the preform is made of carbon fibers, or under pressure, e.g. when the preform is made of aluminum oxide ($Al_2O_3$).

The use of such MMC-materials for the molded part is advantageous because for the conductor passages an insulating material can be used which has a higher melting point than the melting point of the material used for making a molded part or casing. Thus, a qualitatively high-grade (high-melting) glass as well as a high-melting ceramic material can be used as insulating material for the conductor passages.

Also in these embodiments, the conductors in the conductor passages 4 can be cast simultaneously with the molded part and thus formed from the matrix of the MMC-material, or of a different metal when already bonded to the tube 3 before casting the molded part.

Figure 3:
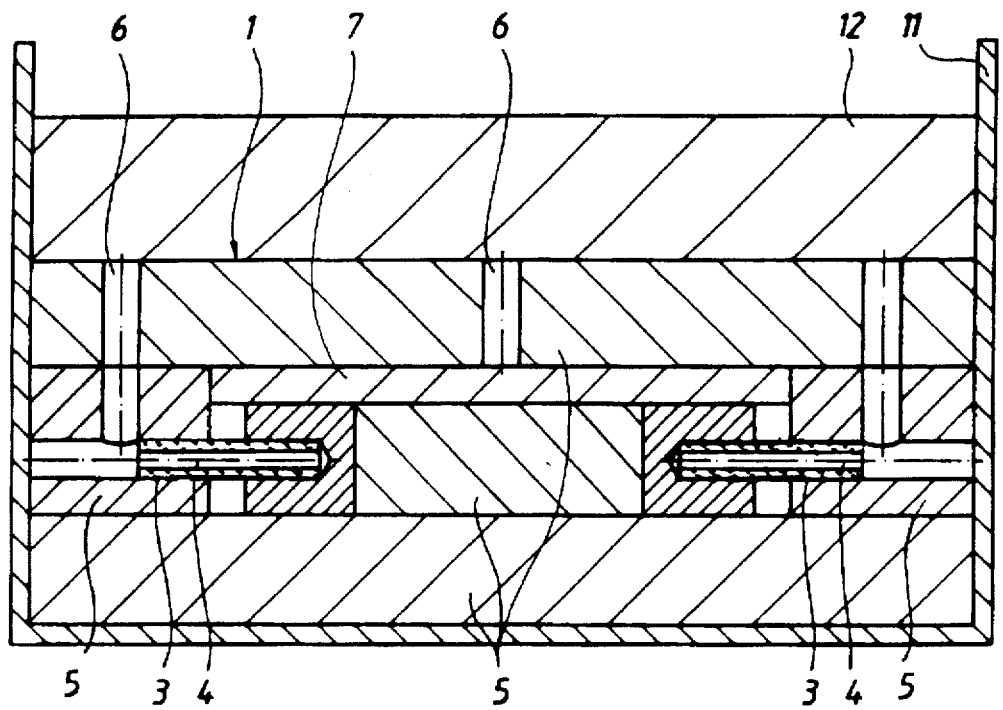

FIG. 3 shows a casting mold 1 in which the cavity 2 is only partially filled with a preform 7 of a MMC-material. In all other aspects, this casting mold corresponds to the casting mold described in connection with FIG. 2.

Figure 4:
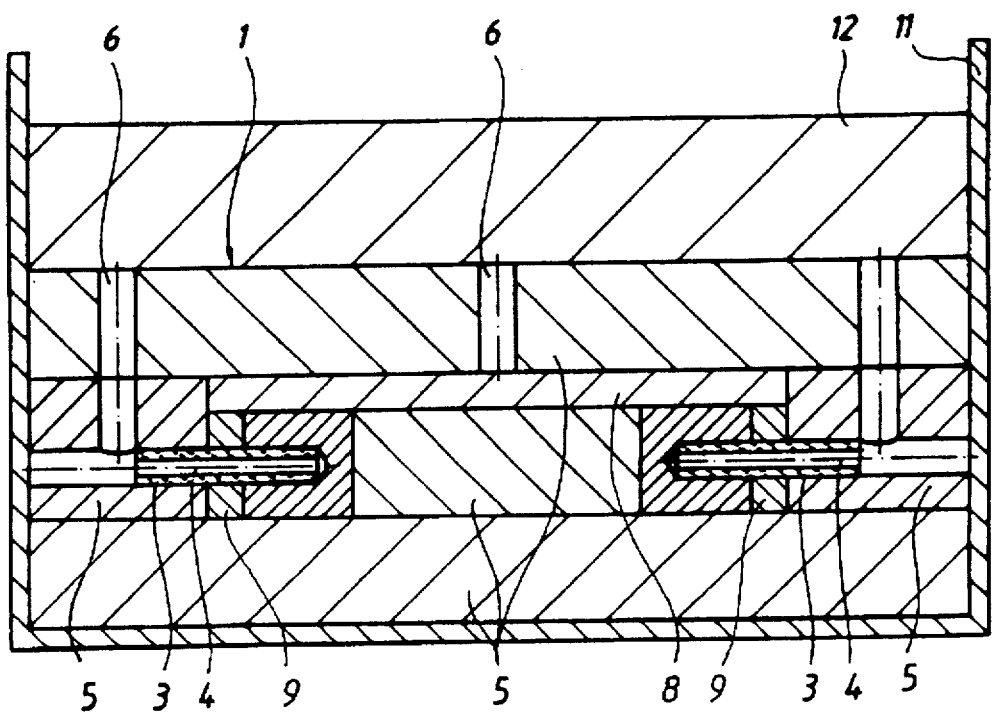

FIG. 4 shows a casting mold 1 in which the cavity 2 is filled with preforms 8, 9 of either different material, or of same material but different density i.e. bulk density or apparent density, different surface treatment or the like. The preform 8 may be made from e.g. a pressed silicon carbide, and the preform 9 may be made also of silicon carbide that is however only loosely introduced into the cavity 2 to effect a different density. Thus, the molded part has different expansion coefficients and the production of such preforms is considerably simpler and cheaper.

Alternatively, the preform 8 may be made of silicon carbide and the preform 9 of AlN, or vice versa. In any event, also in this manner, areas of the molded part can have different thermal expansion coefficients.

Figure 5:
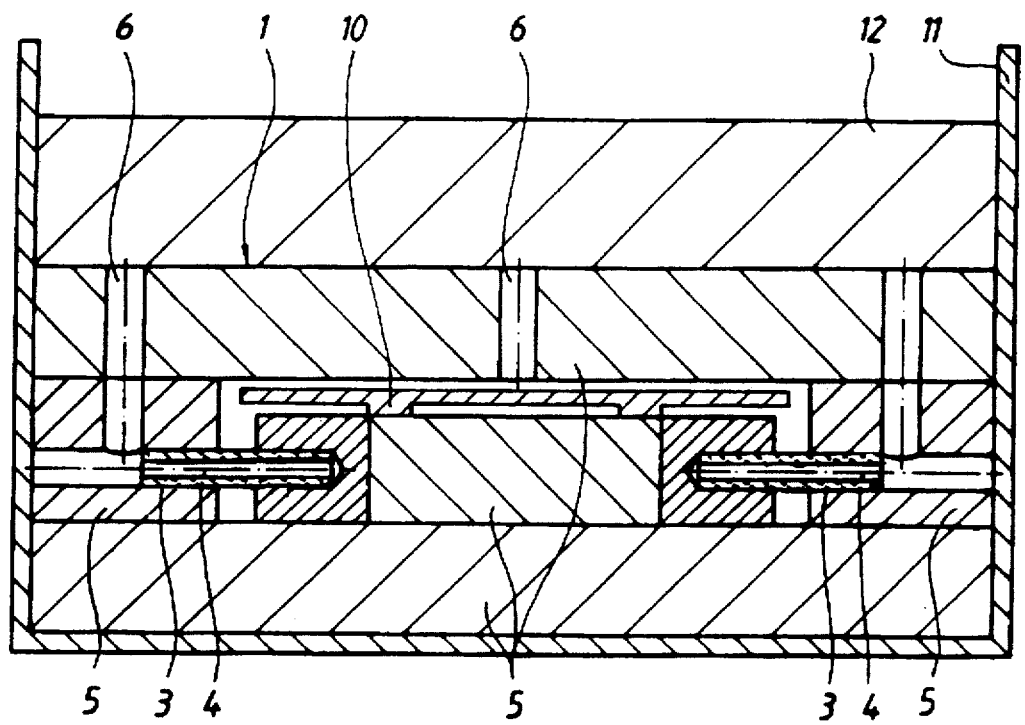

FIG. 5 shows a sectional view of a casting mold 1 in which the cavity 2 receives only a core 10 of a preform of MMC-material. This configuration of the casting mold is in particular of interest when casting a molded part, especially as casings for electronic components with wall areas of different thermal conductivity.

While the invention has been illustrated and described as embodied in a molded part, and method of and apparatus for making a molded part, it is not intended to be limited to the details shown since various modifications and structural changes may be made without departing in any way from the spirit of the present invention.

What is claimed as new and desired to be protected by Letters Patent is set forth in the appended claims.

I claim:

1. A casing for electronic components, comprising a body made in one piece of a material selected from the group consisting of metal and metal matrix composite and defined by a melting point, said body having passages for receiving conductors, said passages being electrically insulated by insulating material having a melting point greater than the melting point of said body, thereby enabling a casting of said body onto said electrically insulated passages.

2. The casing of claim 1 wherein said insulating material is selected from the group consisting of ceramics and glass.

3. The casing of claim 2 wherein said insulating material is formed with a metal coating or metal plating onto which the material of said body is cast.

4. The casing of claim 1 wherein the conductors received in said passages are made of a same material as said body.

* * * * *